Figure 1:
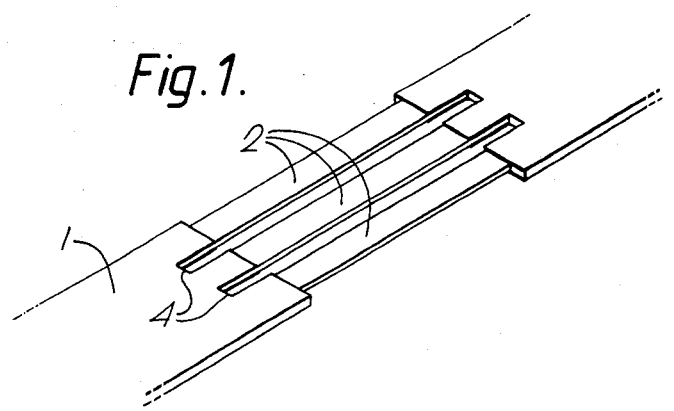

United States Patent [19]

Ritter

[11] Patent Number: 4,488,763
[45] Date of Patent: Dec. 18, 1984

[54] FLAT ELECTRICAL CABLE

[75] Inventor: Friedhelm Ritter, Gilching, Fed. Rep. of Germany

[73] Assignee: Raychem Corporation, Menlo Park, Calif.

[21] Appl. No.: 256,574

[22] Filed: Apr. 22, 1981

[30] Foreign Application Priority Data

Apr. 22, 1980 [GB] United Kingdom ............... 8013263

[51] Int. Cl.³ .............................................. H05K 1/00
[52] U.S. Cl. .......................... 339/17 F; 339/176 MF
[58] Field of Search ................... 174/117 PC, 117 F; 339/17 F, 176 MF, 97 P, 275 R, 275 B, DIG. 1

[56] References Cited

U.S. PATENT DOCUMENTS

| 3,102,767 | 9/1963 | Schneck | 339/176 |
| 3,267,410 | 8/1966 | Baer et al. | 339/17 F |
| 4,066,840 | 1/1978 | Allgaier | 339/176 MF |
| 4,077,692 | 3/1978 | Ellis et al. | 339/DIG. 1 |

FOREIGN PATENT DOCUMENTS

| 1088295 | 9/1960 | Fed. Rep. of Germany . |
| 1135541 | 8/1962 | Fed. Rep. of Germany . |
| 512833 | 8/1971 | Fed. Rep. of Germany . |
| 2322265 | 5/1973 | Fed. Rep. of Germany . |
| 2438878 | 2/1976 | Fed. Rep. of Germany . |
| 2089461 | 9/1978 | Fed. Rep. of Germany ... 339/DIG. 1 |
| 2903830 | 8/1980 | Fed. Rep. of Germany . |
| 61785 | 6/1951 | France . |
| 1419416 | 12/1975 | France .......................... 339/176 MF |
| WO81/00491 | 2/1981 | PCT Int'l Appl. . |
| 1444088 | 7/1976 | United Kingdom ............. 339/176 |
| 1523602 | 9/1978 | United Kingdom . |
| 2019666 | 4/1979 | United Kingdom . |
| 2030013 | 3/1980 | United Kingdom ............. 339/176 |
| 2074399 | 10/1981 | United Kingdom ............. 339/176 |

Primary Examiner—Eugene F. Desmond
Assistant Examiner—David L. Pirlot
Attorney, Agent, or Firm—Herbert G. Burkard; James W. Peterson

[57] ABSTRACT

A flat electrical cable (1) is provided with connecting pins (5) by forming a compacted upstanding fold along its length, and by securing this fold by means of a reinforcing strip (6) bonded to and bridging the conductor's insulation. The reinforcing strip may have pegs (7) which pass between the pins (5). The connecting pins can be connected to leads (16) by solder-containing heat-shrunk connecting sleeves (15).

3 Claims, 7 Drawing Figures

FLAT ELECTRICAL CABLE

DESCRIPTION

The present invention relates to a flat insulated electrical cable, which term includes flexible printed circuitry, and more specifically systems provided with at least one connector to permit a branch lead to be connected thereto.

The expression "flat cable" is employed in a broad sense to include, inter alia, any conductor comprising a plurality of conducting elements embedded in an insulation and generally aligned in a single plane. The conducting elements will generally be flat, but this is not necessarily so. The expression covers not only such cables whose major surfaces are truly flat, but also so-called "ribbon-cables" whose major surfaces are corrugated due to the variance in thickness between the insulative webbing separating individual conductors and that immediately adjacent the individual conductors. The conducting elements may be solid or stranded and may be of the same of different configuration to that of the overall cable. Also included are single conducting elements in flat insulation.

Whilst means are available to enable a branch lead to be connected to at least one conductor of a flat multiconductor electrical interconnection system such as a flexible printed circuit or other system referred to herein as a flat-cable (e.g. at least one tract of a flexible printed circuit board) in general, such means are bulky as in the case of some insulation displacement devices, or often they do not permit a detachable connection to be made and/or they require a high degree of skill to install, e.g. soldering or welding techniquies.

The present invention can provide a flat cable, which is detachably connectable to at least one branch-off lead with the minimum of skill and without the need for bulky connectors.

Accordingly, the present invention provides an electrical interconnection arrangement comprising a flat cable having at least one region formed into an upstanding fold to provide at least one connecting pin, and reinforcing means bonded to respective portions of the cable insulation on each side of the fold thereby to secure said portions in fixed spatial relationship to each other.

The invention also provides a plug-and-socket assembly comprising the interconnection arrangement of the invention and a socket with mates with the pins.

The invention further provides a method of forming a connection pin in a flat electrical cable intermediate its ends, which comprises producing an upstanding fold in the cable to provide the pin, and bonding reinforcing means to respective portions of the fold thereby to secure said portions in fixed spatial relationship to each other.

Preferably the webbing or other insulation over at least a part of the fold is removed to expose the conducting element or elements to be connected. More preferably the insulation is removed completely over the length of at least one element of the fold, to expose at least one folded element in the form of an upstanding and laminated connector pin. Alternatively, the flat cable could be produced with suitable regions bare of insulation.

The reinforcing means may take the form of a strip, preferably polymeric, bonded to either side of the conductor and bridging the fold. Preferably the reinforcing means is bonded to that side of the conductor remote from the upstanding fold which is bridged, electrically to protect and to insulate the reverse side of the fold and also to enable the pins to be as short and therefore as rigid as desirable. Preferably the reinforcing means when polymeric is bonded to the insulation of the cable by welding (for example ultrasonic) or by similar techniques. Alternatively an adhesive may be employed, or the reinforcing means may be moulded on to, or integrally with, the cable.

In one preferred form of the invention, the insulation is completely removed over the length of all of the conducting elements of the fold and a reinforcing strip is bonded to that side of the cable remote from the fold. In such preferred form, the reinforcing strip is also provided with a plurality of, preferably substantially rigid, upstanding pegs each of which passes adjacent the bared conducting elements of the fold to engage complimentary bores or recesses in a socket properly to locate the socket or to provide polarization of the connection.

Preferably, the reinforcing means is provided with a spacer on that side thereof remote from the fold to space the cable away from a surface on which it rests.

The spacer could be employed to advantage to enable another flat cable to be run along the first cable, in stacked relationship therewith. To this end, the spacing means is conveniently designed positively to locate the other cable laterally thereof to prevent its lateral displacement. In a particularly preferred form, the spacer is designed to provide "snap fit" location of the other cable.

The cable may be provided with a securing member having a hole therein through which the upstanding fold passes, the hole being small enough to maintain the fold in a desired configuration. Since tension in the conductor would tend to open the fold and force the securing member upwards off the fold, the securing member can be a snap fit in position. This can be arranged by providing a projection or recess in the securing member and respectively a recess or projection on the upstanding fold.

Whilst the invention is applicable to any suitable type of cable, of particular interest are flat multi-conductor cables especially those provided with flat conducting elements, i.e. of rectangular cross-section.

The present invention also provides a plug-and-socket assembly, comprising a flat cable, as hereinbefore described, provided with a female socket component detachably connectable to the cable. Such female component preferably comprises a polymeric housing provided with at least one socket contact adapted detachably to engage and to make electrical contact with at least one pin of the cable. Preferably the or each socket contact is in the form of a metal stem having a bifurcated end located in the polymeric housing by snap or other interference fit, the stem of the socket contact passing through the end of the polymeric housing and acting as an electrical terminal for connection to a branch lead. Preferably the or each socket contact is connected to a branch lead using a heat-shrinkable solder-containing connector sleeve as described in UK Pat. No. 1,062,043 and commercially available from Raychem Limited, under the trade mark "Solder Sleeve".

Figure 2:
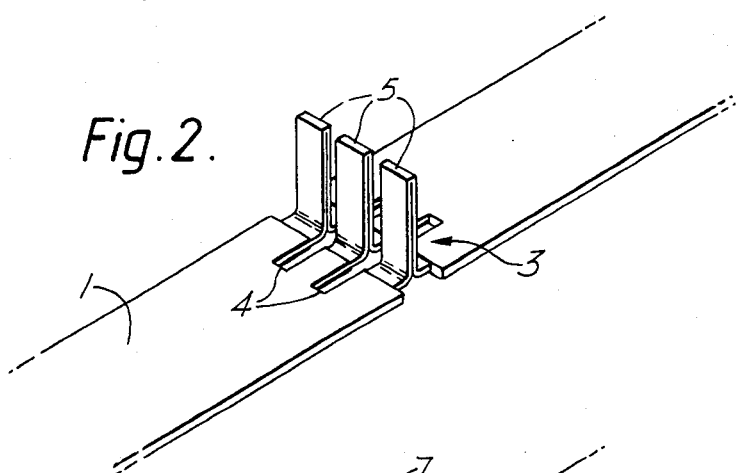
Figure 3:
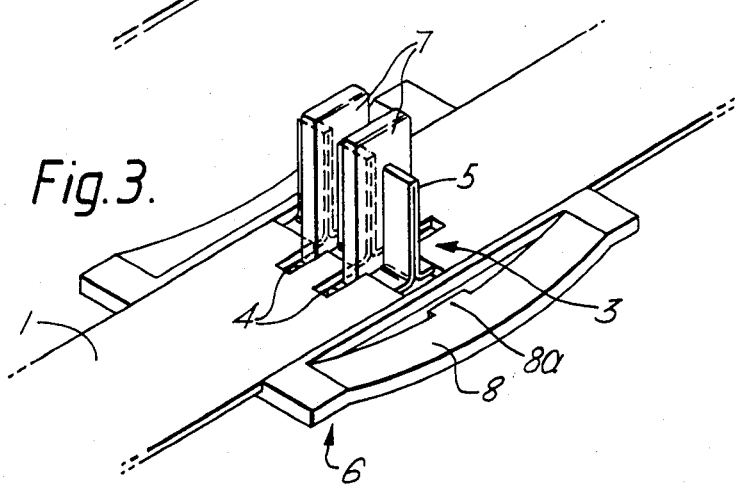
Figure 4:
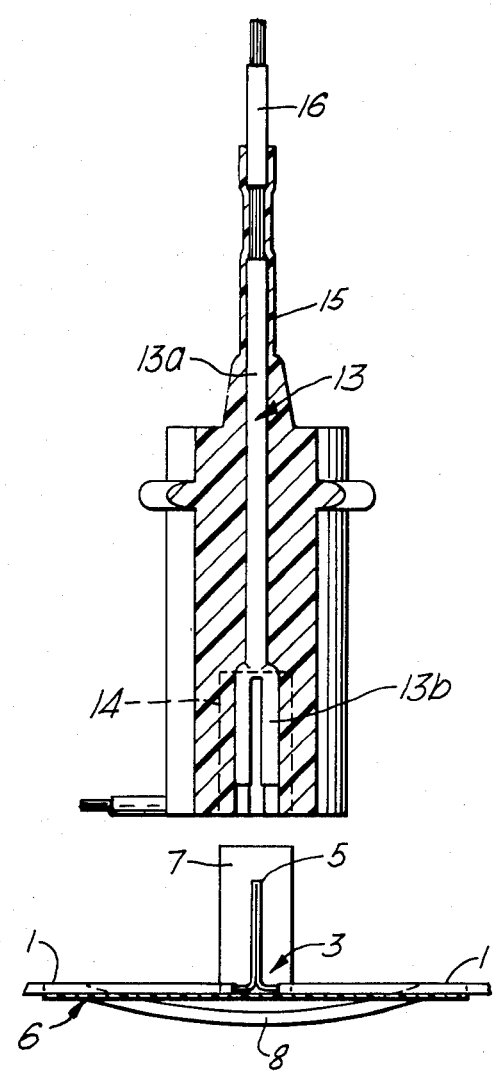
Figure 5:
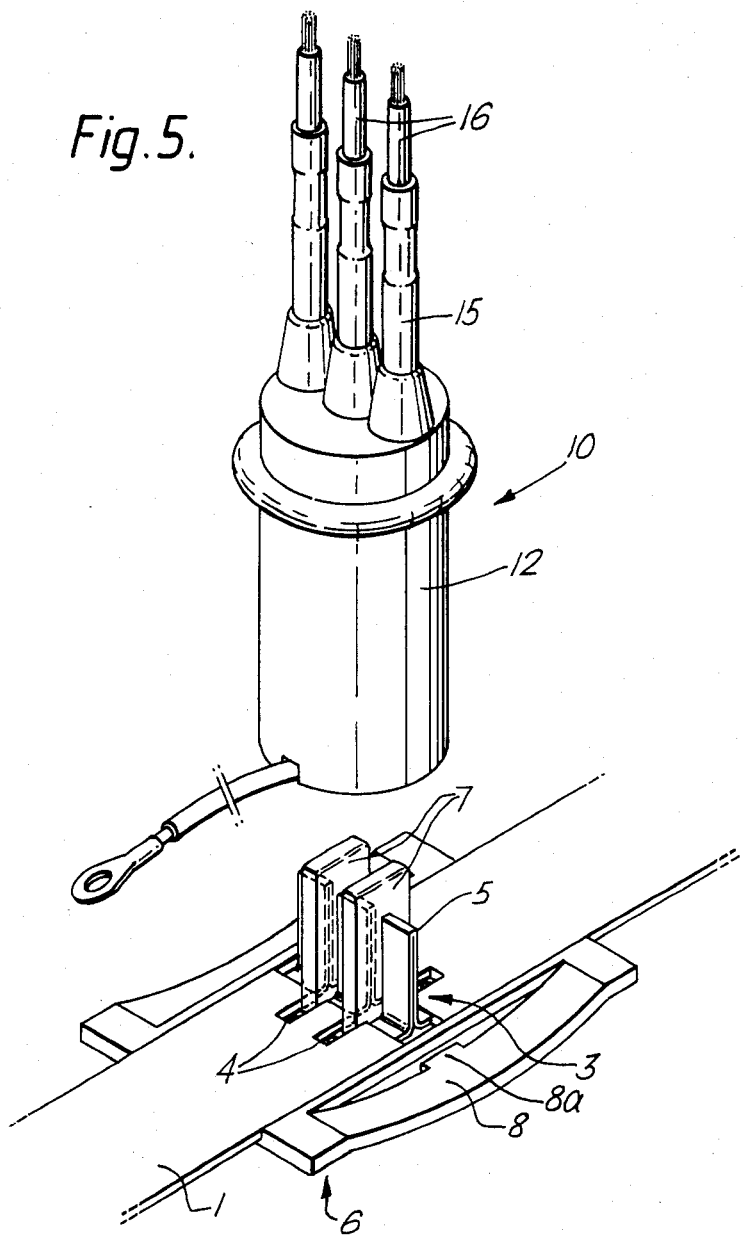
Figure 6:
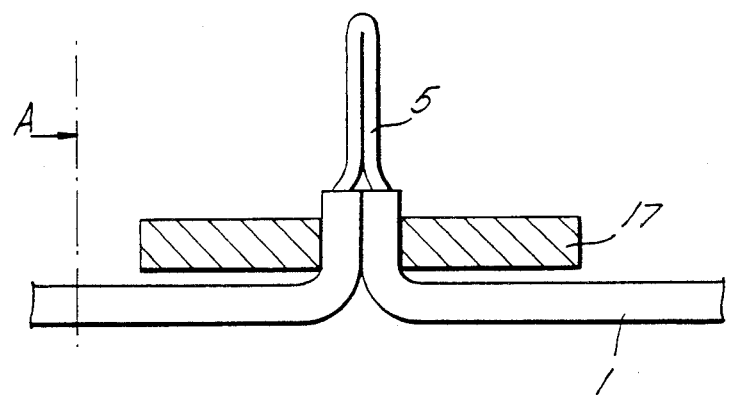
Figure 7:
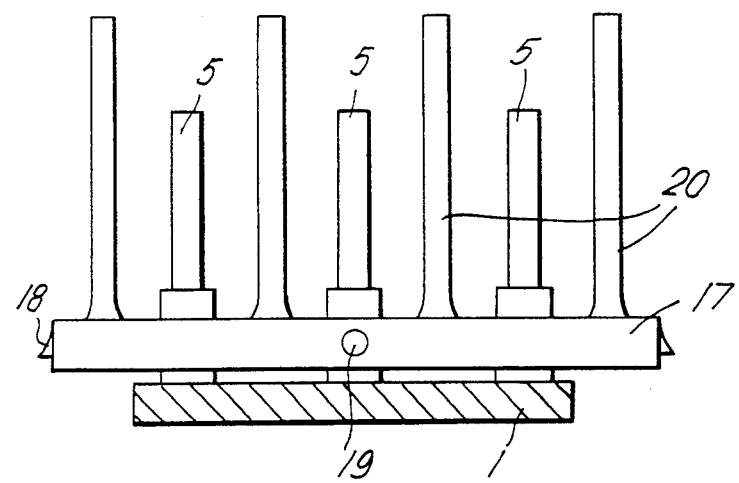

One embodiment of the invention will now be described by way of example with reference to the accompanying drawings, wherein:

FIG. 1 is a schematic perspective view of a flat cable a region of the insulation of which has been bared to expose the conducting elements, FIG. 2 is a schematic perspective view of the cable of FIG. 1 wherein the stripped region has been deformed into a compacted upstanding fold, FIG. 3 is a schematic perspective view of the cable of FIG. 2 including a reinforcing means to maintain the integrity of the upstanding fold to provide the male component of a plug-and-socket assembly, FIG. 4 is a section through the cable of FIG. 3 showing in section a female component of a plug-in-socket assembly suitable for use with the male component of FIG. 3, FIG. 5 is a schematic exploded view of the cable of FIG. 3 illustrating the installation of the female component of FIG. 4, FIG. 6 shows an alternative reinforced means, on the side of the cable above the fold; and FIG. 7 is an end elevation taken in direction A of FIG. 6.

With specific reference to FIG. 5, a flat cable 1 is depicted, each conducting element 2 of which is provided with a branch off lead 16 by means of a socket 10. The plug-and-socket assembly therefore comprises a detachable socket or female component 12 shown in detail in FIG. 4 and a male component integrally formed in the cable 1.

The male component of the plug-and-socket assembly is formed in the cable 1 in accordance with the sequence depicted in FIGS. 1, 2 and 3. As shown in FIG. 1, a region 3 of the insulation of the flat cable 1 is removed by, e.g., an abrasion or pyrolysis technique, to expose the bared conducting elements 2. The region 3 stripped of its insulation may be profiled to provide recesses 4 extending longitudinally along the cable. The elements 2 in the stripped region 3 of the cable are then deformed to provide an upstanding and optionally compacted fold as shown in FIG. 2, the elements 2 in the region of the fold taking the form of a plurality of upstanding and laminated connector pins 5. As shown in FIG. 3, on the side of the cable remote from the pins 5, a polymeric (for example cross-linked polyvinylidene fluoride) reinforcing strip 6 is disposed, the reinforcing strip 6 having two upstanding locating pegs 7 (preferably substantially rigid) which pass through the adjacent recesses 4 in the insulation. These pegs can have many functions, for example insulation protection, guiding, or polarization which would prevent the pins being connected to a socket the wrong way around. The pins themselves could be arranged to prevent incorrect connection. The reinforcing strip is bonded to the insulation at the foot of the fold by, for example, an ultrasonic welding technique to bridge the foot and maintain the integrity of the fold. The reinforcing strip is also provided with a pair of spacers 8 one on each side thereof, each of which is in the form of a resilient bow. Such spacers 8 serve to space the cable 1 away from a supporting surface to allow the cable to be stacked upon a run of a second cable, the pair of spacers 8 being optionally so spaced as to serve to locate the second cable laterally thereof. Each of the spacers 8 is also provided with a laterally inwardly extending nose 8a so as to provide a snap fit or other interference fit with said second cable.

The female component 12 of the connector assembly 10 depicted in FIGS. 4 and 5, comprises a polymeric (for example cross-linked polyvinylidene fluoride) housing provided with three tinned-copper or other socket contacts 13 which can electrically engage the pins 5 formed by the folded upstanding elements on installation. Each socket contact 13 comprises a stem portion 13a with a bifurcated end 13b, said bifurcated end 13b preferably acting as resistent jaws detachably to engage the connector pins 5 on assembly. The stem portion 13a of each socket connector 13 passes through the closed end of the housing 10 to act as a terminal enabling connection to a branch lead 16. The terminals 13a are conveniently connected to branch off leads using heat-shrinkable solder-containing polymeric sleeves 15 commercially available from Raychem Limited, under the trade mark "Solder Sleeve". The female component 12 is also provided with recesses 14 disposed in register with and of complimentary shape to the locating pegs 7 on the reinforcing strip 6. The recesses 14 co-operate with the pegs 7 on assembly for example to reduce the physical stress on the contact pins 5.

As will be apparent from FIG. 5, installation of a branch lead on a flat cable is very simply and rapidly accomplished by means of the plug-and-socket assembly described. Moreover it will be apparent that such an installation is readily detachable and in addition occupies the minimum of space, features which are particularly important in electronic applications where circuits need to be disconnected and where space is at a premium. As will be appreciated especially when compared to insulation displacement devices which pierce the insulation and bite into the conductors, or crimping, soldering or welding methods, there is no change in the cross-section of the conducting elements nor a reduction in insulation path between the elements over the connector region, i.e. there are no deleterious effect on electrical properties in this region of the cable.

An alternative (or additional) reinforcing means is shown in FIGS. 6 and 7. A flat cable 1 is formed into an upstanding fold 5. Reinforcing means 17 is a generally rectangular block having an elongate hole or a series of holes through which the folds 5 can pass. The reinforcing means 17 also provides upstanding pegs 20, which can serve to protect the folds 5, or which can be used to guide or to polarize a socket which mates with the folds. Catches 18 or 19 may be provided to give an interference or snap fit to such a socket.

I claim:

1. An electrical interconnection arrangement comprising a multi-conductor flat cable having conducting elements and electrical insulation, said cable having at least one region formed into an upstanding fold in which the respective conducting elements are pressed into contact with themselves to provide a group of transversely adjacent connecting pins, and reinforcing means bonded to respective portions of the cable insulation on each side of the fold thereby to secure said portions together in fixed spatial relationship to each other, said reinforcing means providing at least one substantially rigid upstanding peg that passes through the cable adjacent the conducting elements.

2. An electrical interconnection arrangement comprising a multi-conductor flat cable having conducting elements and electrical insulation, said cable having at least one region formed into an upstanding fold in which the respective conducting elements are pressed into contact with themselves to provide a group of transversely adjacent connecting pins, and reinforcing means bonded to respective portions of the cable insulation on each side of the fold thereby to secure said portions together in fixed spatial relationship to each other, said reinforcing means comprising a generally planar member that is located on and bonded to one side only of the cable insulation on the side of the cable remote from the upstanding fold, said reinforcing strip having a spacer on its side remote from the fold which can hold the cable away from a surface on which it rests, the spacer comprising two resilient bows running parallel to the cable along opposite sides thereof.

3. A plug-and-socket assembly comprising:
an interconnection arrangement comprising a multiconductor flat cable having conducting elements and electrical insulation, said cable having at least one region formed into an upstanding fold in which the respective conducting elements are pressed into contact with themselves to provide a group of transversely adjacent connecting pins, and reinforcing means bonded to respective portions of the cable insulation on each side of the fold thereby to secure said portions together in fixed spatial relationship to each other, said reinforcing means providing at least one substantially rigid upstanding peg that passes through the cable adjacent the conducting elements; and a socket for mating with the pins of the interconnection arrangement, said peg engaging with the socket to provide strain relief for the electrical connection between pin and socket, or to provide protection, guiding, insulation or polarization to said electrical connection.

* * * * *